United States Patent [19]
Gill, Jr.

[11] Patent Number: 4,607,232
[45] Date of Patent: Aug. 19, 1986

[54] LOW VOLTAGE AMPLIFIER CIRCUIT
[75] Inventor: Harry A. Gill, Jr., Cupertino, Calif.
[73] Assignee: Raytheon Company, Lexington, Mass.
[21] Appl. No.: 718,617
[22] Filed: Apr. 1, 1985
[51] Int. Cl.$^4$ .......................... H03F 3/45; H03F 3/26
[52] U.S. Cl. .................... 330/255; 330/257; 330/261; 330/267
[58] Field of Search .............. 330/252, 255, 257, 261, 330/263, 267, 288, 311; 323/315, 316

[56] References Cited
U.S. PATENT DOCUMENTS
4,267,519 5/1981 Schade, Jr. .......................... 330/255

Primary Examiner—Eugene R. LaRoche
Assistant Examiner—Steven J. Mottola
Attorney, Agent, or Firm—Richard M. Sharkansky; Denis G. Maloney

[57] ABSTRACT

An electronic circuit is provided comprising: a pair of transistors having collector electrodes connected together at an output terminal and emitter electrodes coupled to opposite potentials of a voltage supply; a current source; and, means, responsive to a current produced by the current source, for establishing bias currents to base electrodes of the pair of transistors in accordance with an input signal, such bias currents being dependent on the current produced by the current source and being substantially independent of, over a nominal operating supply voltage range of the circuit, of variations in the voltage supply. With such arrangement, since the bias current to the transistors are provided from a current source, the bias currents are independent of the voltage supply and the circuit may operate with less than a one volt voltage supply. In accordance with a preferred embodiment of the invention, a resistor is coupled between the voltage supply and an emitter of one of the pair of transistors. With such arrangement current gain is provided. Further, the supply voltage may be as low as $2V_{CE(SAT)}+IR$ where IR is the voltage drop across the resistor, typically 30 millivolts. Hence, the minimum supply voltage is still less than one volt.

12 Claims, 1 Drawing Figure

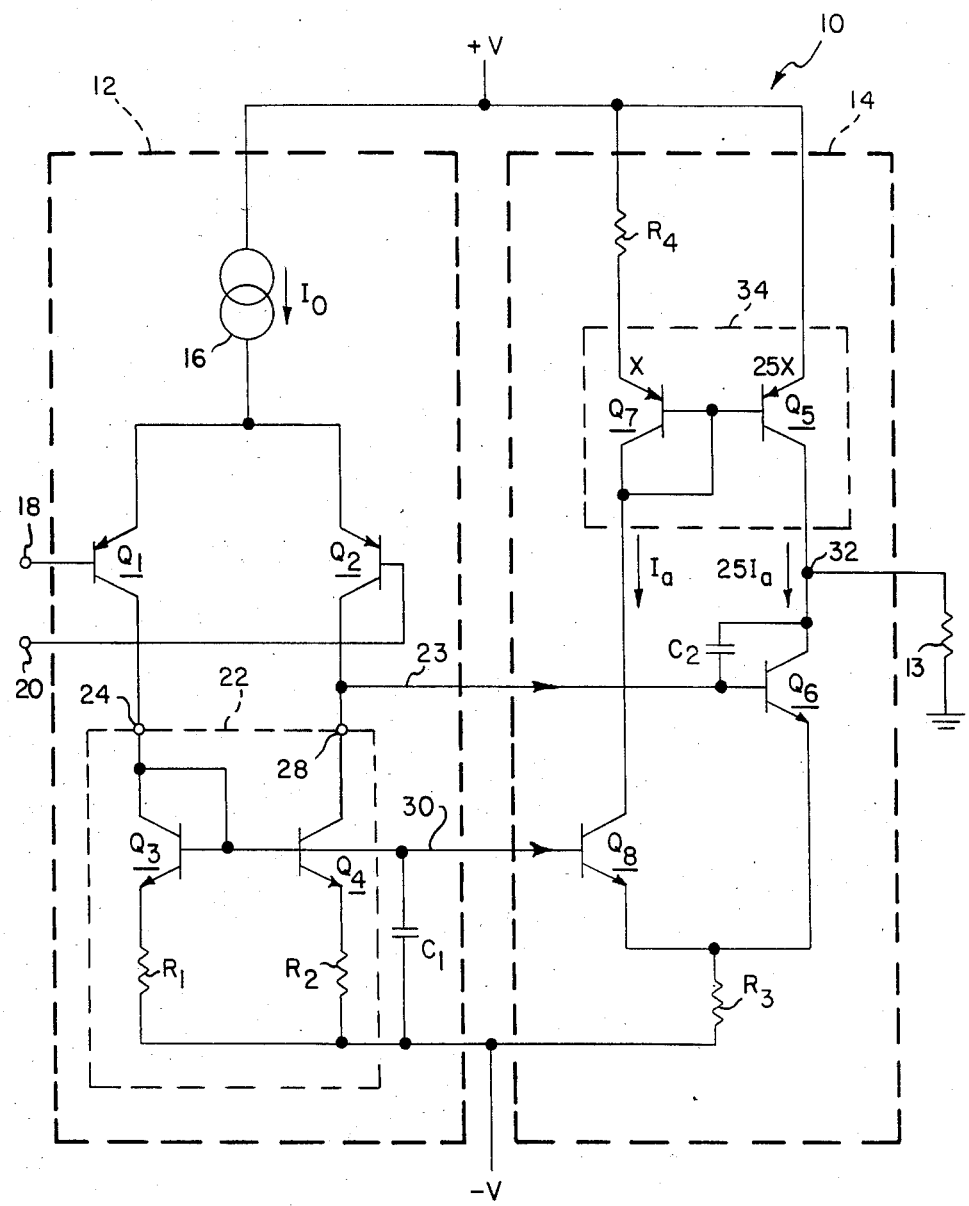

LOW VOLTAGE AMPLIFIER CIRCUIT

BACKGROUND OF THE INVENTION

This invention relates generally to amplifier circuits and more particularly to bipolar transistor amplifier circuits adapted to operate with low supply voltages.

As is known in the art, it is sometimes desirable to provide bipolar transistor amplifier circuits which are able to operate with relatively low voltage supplies, typically 1.5 volt supplies. Further, since this 1.5 volts is the nominal voltage of the supply, as the supply, typically a dry cell battery, ages the voltage decreases and hence it is generally required to design the circuit so that it operates properly with as little as 1.0 to 1.1 volts. One type of amplifier circuit includes a pair of transistors arranged as a complementary emitter follower output stage; one of such transistors being an NPN transistor and the other a PNP transistor. The emitter electrodes are connected together at an output terminal and the collector electrodes are connected to opposite polarities of a voltage supply. An input signal is coupled to the base electrode of a third transistor, the emitter and collector electrodes thereof being connected between the collector and base electrodes of the PNP transistor. A diode connected PNP transistor provides a current source between the collector and base of the NPN transistor. With such arrangement, the supply voltage is normally limited to $2(V_{CE}+V_{BE})$ or 1.8 volts. In another type of amplifier circuit, a PNP and an NPN transistor are provided with the collector electrodes connected together at a common output terminal. The emitter of the PNP transistor is connected to the positive polarity of the voltage supply and the emitter electrode of the NPN transistor is connected to the negative potential of the supply. A pair of resistors is connected serially between the base electrodes of the transistors and an input signal is fed to the junction between the pair of resistors. With such arrangement, since the bias current through the resistors is a function of the supply voltage, in order to provide a bias current, the supply voltage is limited to a minimum level of $2V_{BE}$ or about 1.1 volts.

SUMMARY OF THE INVENTION

In accordance with the present invention, an electronic circuit is provided comprising: a pair of transistors having collector electrodes connected together at an output terminal and emitter electrodes coupled to opposite potentials of a voltage supply; a current source; and, means, responsive to a current produced by the current source, for establishing bias currents to base electrodes of the pair of transistors in accordance with an input signal, such bias currents being dependent on the current produced by the current source and being substantially independent, over a nominal operating supply voltage range of the circuit, of variations in the voltage supply. With such arrangement, since the bias current to the transistors are provided from a current source, the bias currents are independent of the voltage supply and the circuit may operate with less than a one volt voltage supply.

In accordance with a preferred embodiment of the invention, a resistor is coupled between the voltage supply and an emitter of one of the pair of transistors. With such arrangement current gain is provided. Further, the supply voltage may be as low as $2V_{CE}(SAT)+IR$ where IR is the voltage drop across the resistor, typically 30 millivolts. Hence, the minimum supply voltage is still less than one volt.

BRIEF DESCRIPTION OF THE DRAWING

The foregoing features of this invention, as well as the invention itself, may be more fully understood from the following detailed description read together with the accompanying drawing, in which the single FIGURE is a schematic diagram of an amplifier circuit according to the invention.

DESCRIPTION OF THE PREFERRED EMBODIMENT

Referring now to the single FIGURE, an amplifier circuit 10 is shown having an emitter coupled differential amplifier section 12 driving a load 13 through an output stage 14. The differential amplifier section 12 includes a pair of PNP transistors, $Q_1$, $Q_2$, having emitter electrodes connected to the positive potential, $+V$, of a voltage supply through a constant current source 16. The base electrodes of the transistors $Q_1$, $Q_2$ are coupled to a pair of input terminals 18, 20, respectively, as shown. The collector electrodes of transistors $Q_1$, $Q_2$ are connected to a current mirror 22. More particularly, the input 24 to the current mirror 22 is connected to the collector electrode of transistor $Q_1$ and the output 28 of such current mirror 22 is connected to the collector electrode of transistor $Q_2$ and also to the output stage 14 via line 23, as shown. Current mirror 22 thus includes a diode connected transistor $Q_3$ having the base and collector electrodes thereof connected together and to input 24 and having the emitter connected to the negative potential, $-V$, of the voltage supply through a resistor $R_1$. A second transistor $Q_4$ has: its base electrode connected to the base electrode of transistor $Q_3$ and also to both the negative potential $-V$ through a capacitor $C_1$ and to the output stage 14 via line 30; its collector electrode connected to output 28 and its emitter connected to the negative potential $-V$ through resistor $R_2$; where the resistance of $R_1$ is here equal to the resistance of $R_2$; here $R_1=R_2$ equals 3.8K ohms. Further, the emitter areas of $Q_1$ and $Q_2$ are equal to each other. Thus, the portion of the current $I_o$ (here 15 to 20 microamps) produced by current source 16 passing through transistor $Q_1$ to input 24 of the current mirror 22 is mirrored by the current mirror 22 into a substantially equal current into the collector of transistor $Q_4$.

The output stage 14 includes a pair of output transistors $Q_5$, $Q_6$ having the emitter and collector electrodes thereof serially coupled between the positive and negative potentials of the voltage supply. Thus, transistor $Q_5$, here a PNP transistor, has its emitter electrode connected to the $+V$ potential of the voltage supply and its collector electrode connected together with the collector electrode of transistor $Q_6$ at output terminal 32. The emitter electrode of transistor $Q_6$ is coupled to the negative $-V$ potential of the voltage supply through a resistor $R_3$, here $R_3$ is 187 ohms. Transistor $Q_5$ is part of a current mirror 34, such current mirror 34 including a diode connected transistor $Q_7$. The emitter electrode of transistor $Q_7$ is coupled to $+V$ through a resistor $R_4$, here 25K ohms. The base electrodes of transistors $Q_5$, $Q_7$ are connected together and to the collector electrode of transistor $Q_7$, as shown. The emitter area of transistor $Q_5$ is, here 25 times greater than the emitter area of transistor $Q_7$. Thus, if the input current $I_a$ passes from the positive potential $+V$ through the collector of transistor $Q_7$, the output current of mirror 34, i.e., the current passing out of the collector of of $Q_5$, is $25I_a$, as shown. Capacitor $C_2$ (here 33 pica farads) is connected between the base and collector electrodes of transistor $Q_6$ and such capacitor $C_2$, along with capacitor $C_1$ (here 220 pica farads), provide high frequency stabilization for the circuit 10. The collector of transistor $Q_7$ is connected to the emitter of transistor $Q_8$. The collector of transistor $Q_8$ is coupled to the negative potential $-V$ of the voltage supply through a resistor $R_3$, as shown. The inputs to the output stage 14, i.e., lines 23, 30, are coupled to the base electrodes of transistors $Q_6$, $Q_8$, respectively, as shown. The emitter area of transistor $Q_8$ is here twice the emitter area of transistor $Q_7$ and the emitter area of transistor $Q_6$ is here four times larger than the emitter area of transistor $Q_7$.

In operation, and considering first, the condition when the base electrode of transistor $Q_1$ is made slightly negative with respect to the base of transistor $Q_2$. Under such condition, the current through the collector of transistor $Q_1$ becomes greater than the current through the collector of transistor $Q_2$. Current mirror 22 tends to draw a current through transistor $Q_4$ equal to the current through transistor $Q_1$. To obtain this current into the collector of transistor $Q_4$, a bias current tends to be drawn from the base of transistor $Q_6$ with the result that transistor $Q_6$ is biased to a non-conducting condition. However, a voltage is produced at the base of transistor $Q_8$ to bias transistor $Q_8$ to a conducting condition and a current $I_a$ passes through resistor $R_3$. It is first noted that the current $I_a$ through $R_3$ is insufficient to bias transistor $Q_8$ off. Further, because the 25 to 1 emitter area ratio of transistors $Q_5$, $Q_7$, a current $25I_a$ (or greater because of resistor $R_4$, here 25K ohms) passes to load 13 with the voltage at terminal 32 going positive. On the other hand, when the voltage at the base electrode of transistor $Q_1$ is more positive than the voltage at the base of transistor $Q_2$, the current through the collector of transistor $Q_2$ is greater than the current through the collector of transistor $Q_1$. Further, since the current mirror 22 draws through the collector of transistor $Q_4$, a current equal to the current through the collector of transistor $Q_1$, the excess current passes into the base of transistor $Q_6$. Further, as the current through the collector of transistor $Q_6$ increases, the voltage across resistor $R_3$ rapidly increases biasing transistor $Q_8$ to a non-conducting condition. Thus, the current passing through transistor $Q_6$ is drawn from the load to drive the voltage at output terminal 32 negative. It is first noted that the effect of resistor $R_3$ is to increase the current gain because for a fixed bias current to the base of transistor $Q_6$, transistor $Q_6$ will draw a predetermined amount of collector current. Since transistor $Q_5$ is substantially non-conducting, this required collector current must come from the load 13. To put it another way, in the absence of resistor $R_3$ for this fixed bias current into the base of transistor $Q_6$, the required collector current would be made up of some portion coming from transistor $Q_5$ as well as from the load 13. With resistor $R_3$ biasing towards non-conduction transistor $Q_5$, transistor $Q_6$ (for this fixed current into its base) draws more current from the load 13 than if transistor $Q_5$ were in a more conducting condition. The effect then of resistor $R_3$ is to increase the current gain of the output stage 14. Gain is provided when current is passed to the load 13 from transistor $Q_5$ because such transistor is controlled by the voltage at its base electrode from mirror 22. In this regard, transistor $Q_6$ may be considered as a common emitter stage and transistor $Q_8$, a common base stage. In any event, when transistor $Q_6$ conducts, the maximum voltage across resistor $R_3$ is 30 to 40 mV. Thus, the voltage supply between $+V$ and $-V$ may be as little as 1.0 volt. It is further noted the bias currents to the base electrodes of transistors $Q_6$, $Q_8$ are dependent on the constant current source 16 and hence are, over the nominal supply voltage operating range, independent of the supply voltage. Further, since the bias current to the base of transistor $Q_5$ is controlled by the base bias current to transistor $Q_8$, it follows that the bias current to the base of transistor $Q_5$ is also dependent on the current produced by the current source 16 and is substantially independent, over a nominal supply voltage operating range, on variations in the supply voltage.

Having described a preferred embodiment of the invention, it is now evident that other embodiments incorporating these concepts may be used. It is felt, therefore, that this invention should not be restricted to the disclosed embodiment but rather should be limited only by the spirit and scope of the appended claims.

What is claimed is:

1. An electrical circuit comprising:
   (a) a pair of transistors having collector electrodes connected together at an output terminal and emitter electrodes coupled to a voltage supply;
   (b) a current source; and,
   (c) means, responsive to current produced by the current source, for establishing bias currents to base electrodes of the pair of transistors in accordance with an input signal, such bias currents being dependent on the current produced by the current source and being substantially independent, over a nominal operating voltage range of the circuit, of variations in the voltage supply, said bias current establishing means comprising:
      (i) a third transistor having an emitter electrode coupled to the emitter electrode of a first one of the pair of transistors and a collector electrode coupled to the base electrode of a second one of the pair of transistors; and
      (ii) means, comprising a current mirror, for dividing current produced by the current source between the base electrode of the third transistor and the base electrode of the first one of the pair of transistors selectively in accordance with the input signal.

2. The circuit recited in claim 1 including additionally a resistor coupled between the emitter electrode of the first and third transistors and the voltage supply.

3. The circuit recited in claim 2 including a p-n junction coupled between the voltage supply and both the base electrode of the second transistor and the collector electrode of the third transistor.

4. The circuit recited in claim 3 wherein the p-n junction and the second one of the pair of transistors are coupled to provide a current mirror, the current through the collector of the second one of the pair of transistors being a multiple of the current through the p-n junction.

5. An electrical circuit comprising:
   (a) a pair of transistors having collector electrodes connected together at an output terminal and emitter electrodes coupled to a voltage supply;
   (b) a current source;
   (c) a third transistor having an emitter electrode coupled to the emitter electrode of a first one of the pair of transistors and a collector electrode coupled to the base electrode of a second one of the pair of transistors;

(d) a resistor coupled between the emitter electrode of the first one of the pair of transistors and the voltage supply; and (e) means for directing current produced by the current source between the base electrode of the third transistor and the base electrode of the first one of the pair of transistors in accordance with an input signal.

6. The circuit recited in claim 5 including a p-n junction coupled between the voltage supply and both the base electrode of the second one of the pair of transistors and the collector electrode of the third transistor.

7. The circuit recited in claim 6 wherein the p-n junction and the second one of the pair of transistors are coupled to provide a current mirror, the current through the collector of the second one of the pair of transistors being a multiple of the current through the p-n junction.

8. An electrical circuit comprising:

(a) a first pair of transistors having collector electrode connected together at an output terminal and emitter electrodes coupled to a voltage supply;

(b) a current source;

(c) a third transistor having an emitter electrode coupled to the emitter electrode of a first one of the first pair of transistors and a collector electrode coupled to the base electrode of a second one of the first pair of transistors;

(d) a second pair of transistors having emitter electrodes connected to the current source and base electrodes fed by an input signal; and, (e) a current mirror having an input connected to the collector electrode of a first one of the second pair of transistors and an output coupled to: a collector electrode of a second one of the second pair of transistors; and, to the base electrode of the first transistor of the first pair of transistors.

9. The circuit recited in claim 8 including a resistor coupled to an electrode of the third transistor and to an electrode of the first one of the first pair of transistors.

10. The circuit recited in claim 8 including a p-n junction and wherein such p-n junction and the second one of the first pair of transistors are connected to provide a second current.

11. An electrical circuit comprising:

(a) an output stage comprising a pair of transistors having collector electrodes connected together at an output terminal and emitter electrodes coupled to a voltage supply, such output stage having a nominal current gain;

(b) a current source;

(c) a third transistor having an emitter electrode coupled to the emitter electrode of a first one of the pair of transistors and a collector electrode coupled to the base electrode of a second one of the pair of transistors;

(d) means for directing current produced by the current source between the base electrode of the third transistor and the base electrode of the first one of the pair of transistors; and (e) means, coupled between the emitter electrode of the first one of the pair of transistors and the voltage supply, for increasing the current gain of said output stage from said nominal current gain.

12. The electrical circuit of claim 11 wherein the current gain increasing means comprises a resistor.

* * * * *